US006380723B1

(12) United States Patent
Sauer

(10) Patent No.: US 6,380,723 B1
(45) Date of Patent: Apr. 30, 2002

(54) METHOD AND SYSTEM FOR GENERATING A LOW VOLTAGE REFERENCE

(75) Inventor: Don R. Sauer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/815,907

(22) Filed: Mar. 23, 2001

(51) Int. Cl.[7] .......................... G05F 3/16; H03K 17/00

(52) U.S. Cl. ...................... 323/315; 323/313; 323/314; 307/297; 327/538

(58) Field of Search ................................ 323/281, 282, 323/273, 312, 313, 314, 315; 307/296, 297; 327/535, 538

(56) References Cited

U.S. PATENT DOCUMENTS 4,317,054 A * 2/1982 Caruso et al. .............. 307/297
4,349,778 A * 9/1982 Davis ......................... 323/314
4,396,883 A * 8/1983 Holloway et al. .......... 323/313
4,506,208 A * 3/1985 Nagano ....................... 323/314
5,434,533 A * 7/1995 Furutani ..................... 327/538
5,570,008 A * 10/1996 Goetz ......................... 323/315
5,587,655 A * 12/1996 Oyabe et al. ............... 323/312
6,046,578 A * 4/2000 Feldtkeller .................. 323/314

* cited by examiner

*Primary Examiner*—Rajnikant B. Patel
(74) *Attorney, Agent, or Firm*—Merchant & Gould; Brett A. Hertzberg

(57) ABSTRACT

A single cell voltage reference operates under low power supply requirements to provide a configurable voltage reference. The single cell voltage reference includes a diode device that is biased as a voltage source. Two series connected resistive devices are connected in parallel with the diode device. The diode is biased with a current that is proportional to delta Vbe/R, such that the impedance of the diode tracks R. Another current source that is also proportional to delta Vbe/R is provided at the junction of the two resistors such that the voltage across one of the two resistors may be employed as a reference voltage that is less than 1.2V. The ratio of the resistors and scales the reference voltage level. Voltages that are below 1.2V are provided that are temperature compensated similar to a band-gap reference. The diode voltage as driven by a current source determines the lower limit of the reference voltage. The reference voltage may be combined with a buffer or an operational amplifier such that a regulated supply can be provided that is below 1.2V. Metal masks may be arranged to permit reconfiguration of the voltage reference cell for use above 1.2V, or to change the regulation voltage without redesigning the voltage reference cell.

20 Claims, 5 Drawing Sheets

METHOD AND SYSTEM FOR GENERATING A LOW VOLTAGE REFERENCE

FIELD OF THE INVENTION

The present invention is related to a method and system for generating a low voltage reference that operates with a low power supply voltage. More particularly, the present invention is related to a single cell voltage reference that operates on low-voltage power supplies such as a single cell battery.

BACKGROUND OF THE INVENTION

Band-gap voltage references are used as voltage references in electronic systems. The energy band-gap of Silicon is on the order of 1.2V, and is independent from temperature and power supply variations. Bipolar transistors have a negative temperature drift with respect to their base-emitter voltage (Vbe decreases as operating temperature increases on the order of −2 mV/deg C.). However, the thermal voltage of a bipolar transistor has a positive temperature drift (Vt=kT/q, thus Vt increases as temperature increases). The positive temperature drift in the thermal voltage (Vt) may be arranged to compensate the negative temperature drift in the bipolar transistor's base-emitter voltage. Band-gap reference circuits use the inherent characteristics of bipolar transistors to compensate for temperature effects and provide a stable operating voltage over various power supply and temperature ranges.

One example bandgap reference circuit includes two bipolar transistors that are arranged with a common base. Two resistors are series connected between the emitter of the first bipolar transistor and a common ground. The emitter of second bipolar transistor is connected to the common point between the two resistors. The two bipolar transistors are arranged to provide a ten-to-one (10:1) current density difference with respect to one another. The ten-to-one current density results in a 60 mV difference between the base-emitter voltages of two bipolar transistors ($\Delta$Vbe=Vt*ln(I1/I2)=26 mV*ln(10)=60 mV, at room temperature). The 60 mV difference appears across the first resistor. The voltage between the base of the bipolar transistors and the ground terminal provides a voltage reference (VREF) that is roughly given as VREF=Vbe+X*Vt, where X is a constant that is used to scale the temperature correction factor. The temperature correction factor (X) is adjusted by the ratio of the resistors. Typical temperature corrected reference voltages of 1.25V are achieved by this configuration.

SUMMARY OF THE INVENTION

The present invention is directed to providing a voltage reference that operates from a low power supply voltage. More specifically the present invention is directed to providing a voltage reference that is below 1.2 volts and operated from a low power-supply voltage such as in battery-operated applications.

Briefly stated, a single cell voltage reference operates under low power supply requirements to provide a configurable voltage reference. The single cell voltage reference includes a diode device that is biased as a voltage source. Two series connected resistive devices are connected in parallel with the diode device. The diode is biased with a current that is proportional to delta Vbe/R, such that the impedance of the diode tracks R. Another current source that is also proportional to delta Vbe/R is provided at the junction of the two resistors such that the voltage across one of the two resistors may be employed as a reference voltage that is less than 1.2V. The ratio of the resistors and scales the reference voltage level. Voltages that are below 1.2 V are provided that are temperature compensated similar to a band-gap reference. The diode voltage as driven by a current source determines the lower limit of the reference voltage. The reference voltage may be combined with a buffer or an operational amplifier such that a regulated supply can be provided that is below 1.2V. Metal masks may be arranged to permit reconfiguration of the voltage reference cell for use above 1.2V, or to change the regulation voltage without redesigning the voltage reference cell.

In accordance with a feature of the invention, an apparatus is directed to provide a reference voltage that operates from a low-voltage power supply. The apparatus includes a current source circuit that provides a current that is proportional to a change in base-emitter voltage and inversely proportional to a reference resistance value. A diode circuit is coupled to the current source, wherein the diode circuit has an associated diode voltage. A first resistive circuit that is series coupled to a second resistive circuit, the first resistive circuit and the second resistive circuit sharing a common node, the first and second resistive circuits are arranged in parallel with the diode device to provide a first voltage contribution at the common node that is associated with the current source that is lower than the associated diode voltage. Another current source circuit provides another current to the common node, wherein the another current is proportional to the current such that a second voltage contribution is provided at the common node, wherein the reference voltage is given as the sum of the first voltage contribution and the second voltage contribution.

In accordance with another feature of the invention, an apparatus is directed to providing a regulated voltage from an unregulated power supply that has a first and a second power supply terminal, where the first terminal is coupled to the regulated voltage through a resistor circuit. The apparatus includes a first current source circuit that provides a first current to a first node in response to a control signal. A second current source circuit provides a second current to a second node in response to the control signal. A control signal generator provides the control signal in response to a reference current that is proportional to a change in base-emitter voltage and inversely proportional to a resistance such that the first current and the second current are proportional to the reference current. A diode circuit is coupled between the first node and the second power supply terminal, the diode circuit having an associated diode voltage. A resistance circuit is coupled between the first node and the second node. Another resistance circuit is coupled between the second node and the second power supply terminal. A buffer circuit that has an input that is coupled to the second node and an output that provides the regulated voltage such that the regulated voltage is associated with a reference voltage at the second node.

In accordance with an aspect of the invention, an apparatus is directed to providing a regulated voltage from an unregulated power supply that has a first and a second power supply terminal, where the first terminal is coupled to the regulated voltage through a resistor circuit. The apparatus includes a means for providing a first current is arranged to provide the first current in response to a control signal. A means for providing a second current is arranged to provide the second current in response to the control signal. A means for providing a control signal is arranged to provide the control signal in response to a reference current such that the first current and the second current are proportional to the reference current, wherein the reference current is proportional to a change in base-emitter voltage and inversely proportional to a resistance. A diode means is arranged to provide a diode voltage that is responsive to the first current. A first resistance means is coupled between the diode means and a reference node. A second resistance means is coupled between the reference node and the second power supply terminal. A means for buffering is arranged to produce the regulated voltage from a reference voltage that is associated with the reference node.

In accordance with another aspect of the invention, a method is directed to providing a regulated voltage from an unregulated power supply that is coupled to the regulated voltage through a series circuit. The method includes generating a first current that is proportional to a reference current, wherein the reference current is proportional to a change in a base-emitter voltage and inversely proportional to a resistance value, generating a second current that is proportional to the reference current, biasing a diode circuit with at least one of the first current and the second current to provide a diode voltage, coupling a first resistance circuit between the diode and a reference node, coupling a second resistance circuit to between the reference node and a circuit ground potential such that the first and second resistance circuits produce a portion of a reference voltage at the reference node by dividing the diode voltage, coupling the second current to the reference node to produce a portion of a reference voltage at the reference node such that associated temperature coefficients of the first resistance circuit and the second resistance circuit are cancelled by another associated temperature coefficient of the resistance value wherein the reference voltage is given by the sum of a first constant times the diode voltage and a second constant times the change in the base-emitter voltage, and buffering the reference voltage to produce the regulated voltage from the reference voltage.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediate devices. The term "coupled" means either a direct electrical connection between the things that are connected, or an indirect connection through one or more passive or active intermediary devices. The term "circuit" means either a single component or a multiplicity of components, either active or passive, that are coupled together to provide a desired function.

The present invention relates to voltage references that operate from a low power supply voltage. Typically, it is necessary for the power supply voltage to be higher than the reference voltage. In some applications, such as portable devices or other devices that operate on reduced power supply levels, the maximum power supply voltage may be lower than 1.2 Volts. Conventional band-gap reference circuits require their power supply voltages to exceed 1.2 Volts for proper operation. The present invention is directed to providing a temperature compensated reference circuit that operates on power supply levels that are lower than 1.2 Volts. However, it is understood and appreciated that the concepts discussed in reference to the present invention may be adapted for use in reference circuits that have power supply voltages that exceed 1.2 volts.

Figure 1:
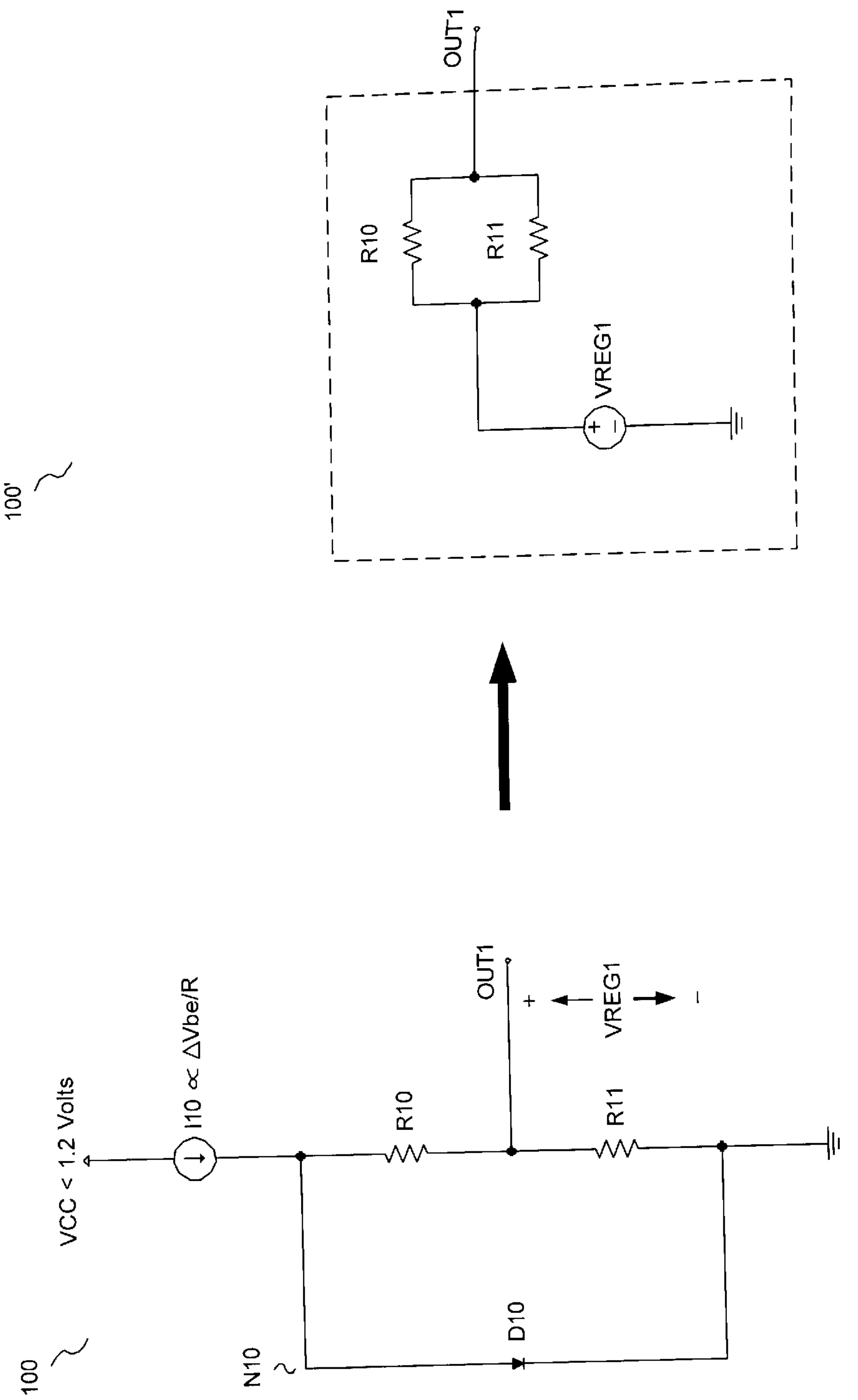
FIG. 1 is a schematic diagram of a single cell voltage reference.

FIG. 1 is a schematic diagram of an exemplary reference (100) circuit that is in accordance with the present invention. The circuit includes a diode (D10), a current source (I10), two resistors (R10, R11), and a single power supply (VCC) that is less than 1.2 volts. The current source (I10) provides a current to node N10 that is proportional to ΔVbe/R. The diode (D10) has an anode coupled to node N10, and a cathode coupled to a circuit ground potential (GND). The first resistor (R10) is series coupled between node N10 and the output node (OUT1). The second resistor (R11) is series coupled between the output node (OUT1) and the circuit ground potential (GND). A voltage (VREG1) appears across the second resistor (R11) between the output node (OUT1) and the circuit ground potential (GND).

The diode (D10) in FIG. 1 will have an associated forward bias voltage. In one example, the forward bias voltage across the diode is on the order of 600 mV. Resistors R10 and R11 form a voltage divider that divides the diode voltage based on the ratio between the resistors (VREG1=Vdiode/(1+R10/R11)). For example, when R10 and R11 are of equal values, and the diode voltage is 600 mV, the potential (VREG1) at the output node (OUT1) will be roughly 300 mV.

An equivalent circuit (100') of circuit arrangement 100 includes a voltage source with a source impedance as shown in FIG. 1. The voltage source has a source impedance that corresponds to the parallel combination of resistors R10 and R11. The voltage source provides a voltage that corresponds to the voltage drop (VREG1) that appeared across resistor R11.

The diode (D10) actually includes a source impedance (not shown) that corresponds to a resistance given by: Re=(kT/q)/Ie. The impedance (Re) of the diode (D10) is included in the value of R10 for purposes of the above-described model. Since the diode is biased with a current that is proportional to ΔVbe/R, the impedance of the diode (Re) will track R.

Figure 2:
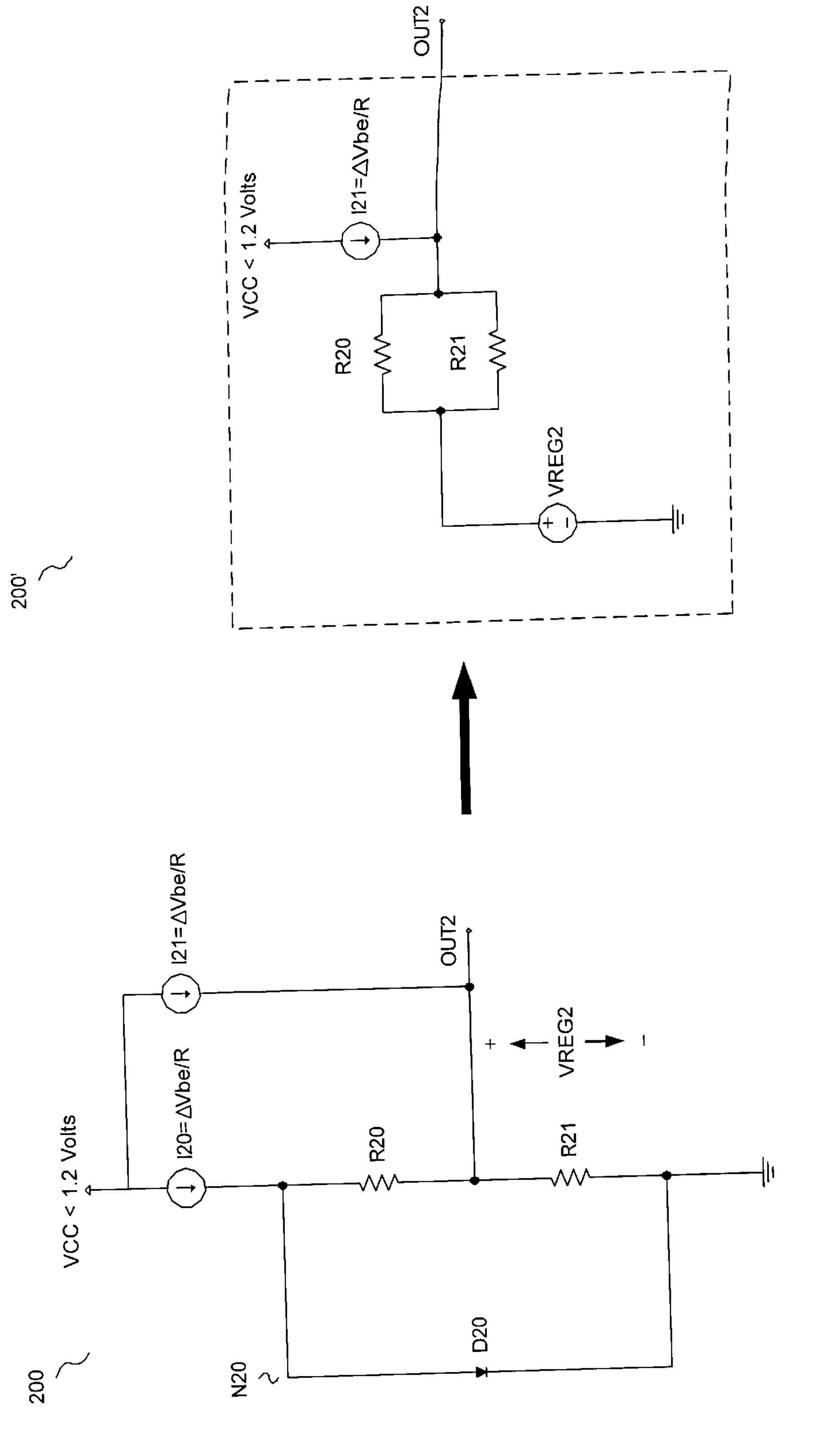
FIG. 2 is a schematic diagram of another single cell voltage reference.

FIG. 2 is a schematic diagram of an exemplary reference circuit (200) that includes temperature compensation in accordance with the present invention. The circuit includes a diode (D20), a first and second current source (I20, I21), two resistors (R20, R21), and a single power supply (VCC) that is less than 1.2 volts. The first current source (I20) delivers a current that is equal to ΔVbe/R through node N20. The second current source (I21) delivers a current, which is also equal to ΔVbe/R, through an output node (OUT2). The diode (D20) has an anode coupled to node N20, and a cathode coupled to a circuit ground potential (GND). The first resistor (R20) is series coupled between node N20 and the output node (OUT2). The second resistor (R21) is series coupled between the output node (OUT2) and the circuit ground potential (GND). A voltage (VREG2) appears across the second resistor (R21) between the output node (OUT2) and the circuit ground potential (GND).

The circuit configuration shown in FIG. 2 is similar to that shown in FIG. 1 with the addition of the second current source (I21). The diode (D20) in FIG. 2 has an associated forward bias voltage. In one example, the forward bias voltage across the diode is on the order of 600 mV. Using superposition, the first current source (I20) and the diode (D20) form a first voltage source that contributes a first portion to the output voltage (VREG2), while the second current source (I21) contributes a second portion to the output voltage (VREG2). Resistors R20 and R21 form a voltage divider that divides the diode voltage based on the ratio between the resistors. For example, when R20 and R21 are of equal values, and the diode voltage is 600 mV, the first portion of the potential (VREG2) at the output node (OUT2) will be roughly 300 mV. The second portion of the potential (VREG2) at the output node (OUT2) is contributed by the second current source (I21), which sources current into the parallel combination of resistors R20 and R21 (where R20 includes the resistance of diode D20).

An equivalent circuit (200') of circuit arrangement 200 includes a voltage source with a source impedance as shown in FIG. 2. The voltage source has a source impedance that corresponds to the parallel combination of resistors R20 and R21. The voltage source provides a voltage (VREG2) that corresponds to the diode voltage divided by the resistor divider network formed by R20 and R21. The second current source is connected to the output node of the equivalent circuit. In one example, the diode has a nominal voltage of 600 mV, and the current sources together with resistors R20 and R21 produce an output voltage of 900 mV. In this example, the equivalent circuit has a voltage source (VREG2) with a voltage of 450 mV that is determined by the resistance of the diode and resistors R20 and R21, and the output impedance of the voltage source is the parallel combination of R20 and R21.

In FIG. 2, the reference circuit (200) provides an output voltage that is well below 1.2 volts. The lower limit of the supply voltage is determined by the current requirements of the diode. Since both current sources (I20, I21) provide a current that is proportional to ΔVbe/R, the impedance (Re) of the diode will track R, and the temperature coefficient of the diode is effectively canceled.

Figure 3:
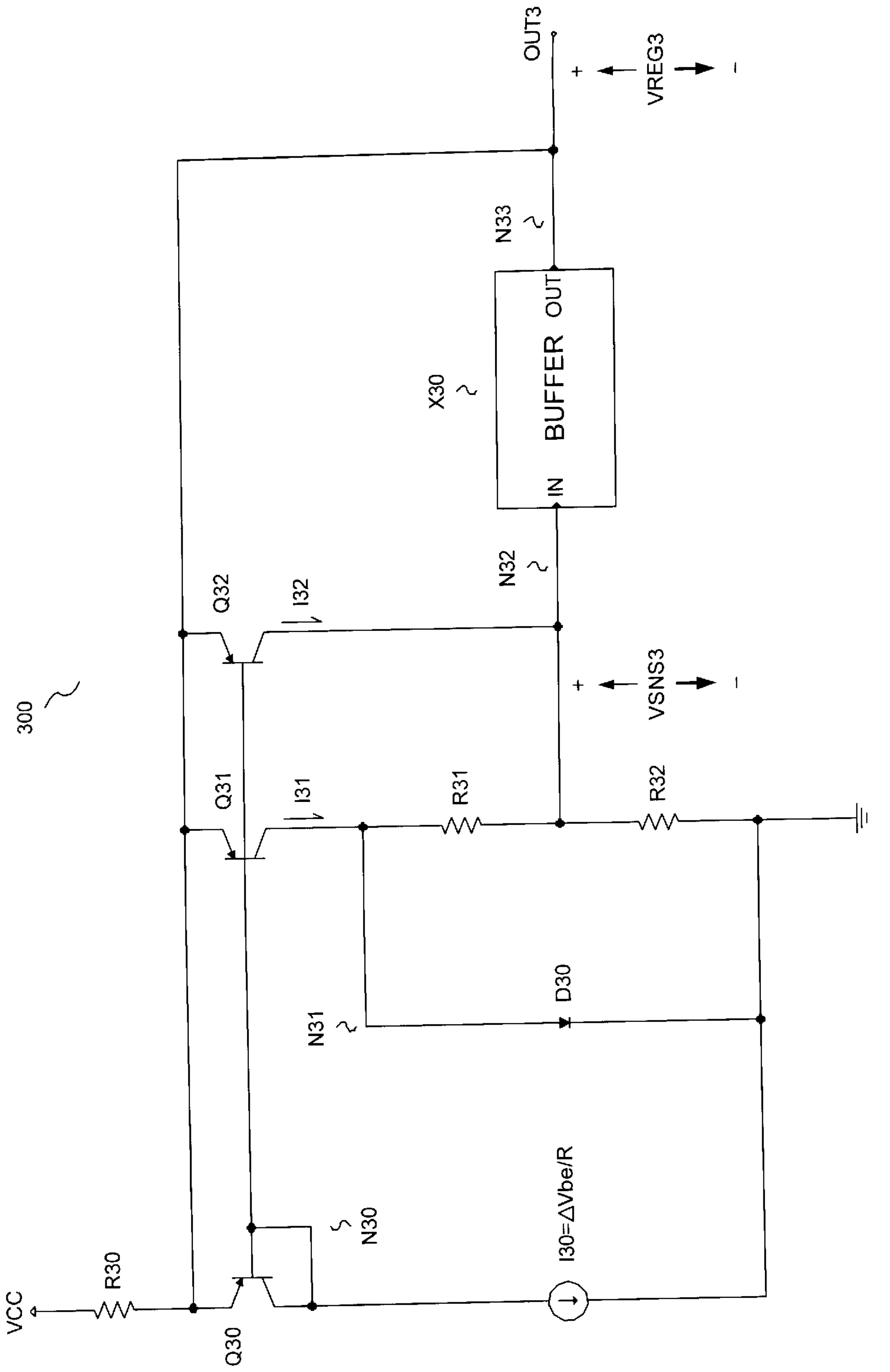
FIG. 3 is a schematic diagram of a shunt regulator including a single cell voltage reference.

FIG. 3 is a schematic diagram of a shunt regulator circuit (300) that that includes a reference circuit that is in accordance with the present invention. The circuit includes a diode (D30), three bipolar junction transistors (Q30–Q31), a buffer circuit (X30), three resistors (R30–R32), and a current source (I30).

The current source (I30) sinks a current out of node N30 that is given as ΔVbe/R. Resistor R30 is coupled in series between an unregulated power source (VCC) and the output node (OUT4). Transistor Q30 is a PNP type transistor that has an emitter connected to node OUT4, and a base and collector that are connected to node N30. Transistor Q31 is a PNP transistor that has an emitter connected to node OUT3, a base connected to node N30, and a collector connected to node N31. Transistor Q32 is a PNP transistor that has an emitter connected to node OUT3, a base connected to node N30, and a collector connected to node N32. Diode D30 has an anode connected to node N31 and a cathode connected to the circuit ground potential (GND). Resistor R31 is connected between nodes N31 and N32. Resistor R32 is connected between node N31 and the circuit ground potential (GND). Buffer X30 has an input connected to node N32 and an output (OUT) connected to node OUT3.

Transistor Q30 is a diode-connected device that is arranged in series with current source I30, transistor Q30 will conduct a current that is given by ΔVbe/R. Transistor Q30 is also arranged to operate as a current mirror with transistors Q31 and Q32. Thus, transistors Q31 and Q32 will deliver currents (I31, I32) to their respective loads at node N31 and N32 that is also given by ΔVbe/R. Transistors Q31 and Q32 are configured to operate similar to current sources I20 and I21 from FIG. 2.

The circuit configuration shown in FIG. 3 is similar to that shown in FIG. 2 with the addition of resistor R30, buffer X30, and current sources I20 and I21 are replaced by transistors Q31 and Q32 respectively. Buffer X30 produces the output voltage of the reference circuit (VREG3) at node OUT3 in response to the voltage that appears across resistor R32 (VSNS3). Using superposition, transistor Q31 provides a portion of current I31 through diode D30 to form a first voltage source that contributes a first portion of the sense voltage (VSNS3). Transistor Q32 provides current I32 to node N32, which contributes a second portion to the sense voltage (VSNS3). Resistors R30 and R31 form a voltage divider that divides the diode voltage based on the ratio between the resistors.

Buffer X30 may be configured to operate as an amplifier with gain, an amplifier with attenuation, or another configuration as may be desired. Buffer X30 has a high impedance input (IN) and does not load down node N32. In one example, buffer X30 includes a level shifter between the input of the buffer and the output of the buffer. The voltage (VSNS3) at node N32 is the reference voltage for the circuit. The buffer circuit (X30) provides a stable regulated output voltage at node OUT3 as given by VREG3. The lower limit on the reference voltage (VSNS3) at node N32 is determined by the minimum current requirements of the diode and the minimum collector to emitter voltages of transistors Q30–Q32 for proper conduction.

Figure 4:
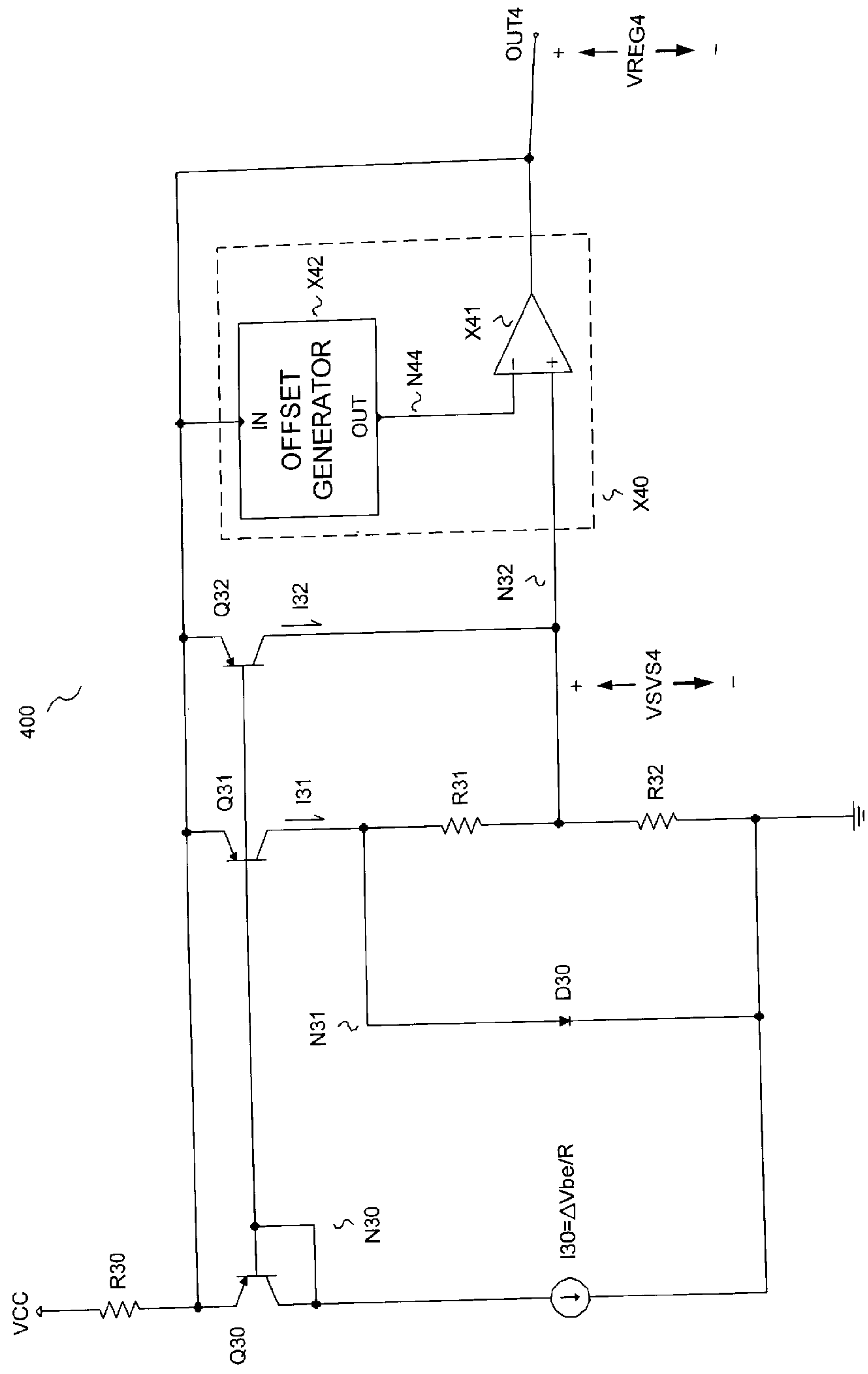
FIG. 4 is a schematic diagram of another shunt regulator including a single cell voltage reference.

Another example of a shunt regulator that employs the teachings of the present invention is shown in FIG. 4. The schematic shown in FIG. 4 is identical to the schematic shown in FIG. 3, except that the buffer X30 has been replaced by buffer X40. Like components and connection nodes from FIG. 3 are labeled identically in FIG. 4. Node OUT4 replaces node OUT3. The output (VREG4) of the shunt regulator (400) shown in FIG. 4 now appears at node OUT4 instead of OUT3. The reference voltage (VSNS4) appears across resistor R32.

As shown in FIG. 4, the buffer (X40) includes an operational amplifier (X41) and an offset generator circuit (X42). The operational amplifier (X41) includes a non-inverting input (+) that is coupled to node N32, an inverting input (–) that is coupled to node N44, and an output coupled to node OUT4. The offset generator circuit (X42) has an input (IN) that is coupled to node OUT4, and an output (OUT) that is coupled to node N44.

The offset generator produces an offset voltage (VOS) that is defined between the input terminal (IN) and the output terminal (OUT) of the offset generator (X42). In this configuration, the operational amplifier will provide an output voltage to node OUT4 that is given as the sum of the sense voltage (VSVS4) and the offset voltage (VOS). For example, when the offset voltage is roughly 200 mV and the sense voltage (VSNS4) at node N32 is roughly 700 mV, the regulated output voltage (VREG4) will be roughly 900 mV.

The 200 mV offset, in this example will result in a collector-emitter voltage for transistors Q30–Q32 that is also 200 mV.

The offset generator and the operational amplifier may be combined into a single electronic circuit (not shown). For example, an offset can be built into the operational amplifier by area scaling the transistor geometries in the input stage of the operational amplifier. In one embodiment of the present invention, the operational amplifier has two stages with a sixty-to-one (60:1) are scaling factor to generate an offset voltage of approximately 200 mV. In light of the above description, it is understood and appreciated that other methods may be used to generate an offset voltage in accordance with the present invention.

Figure 5:
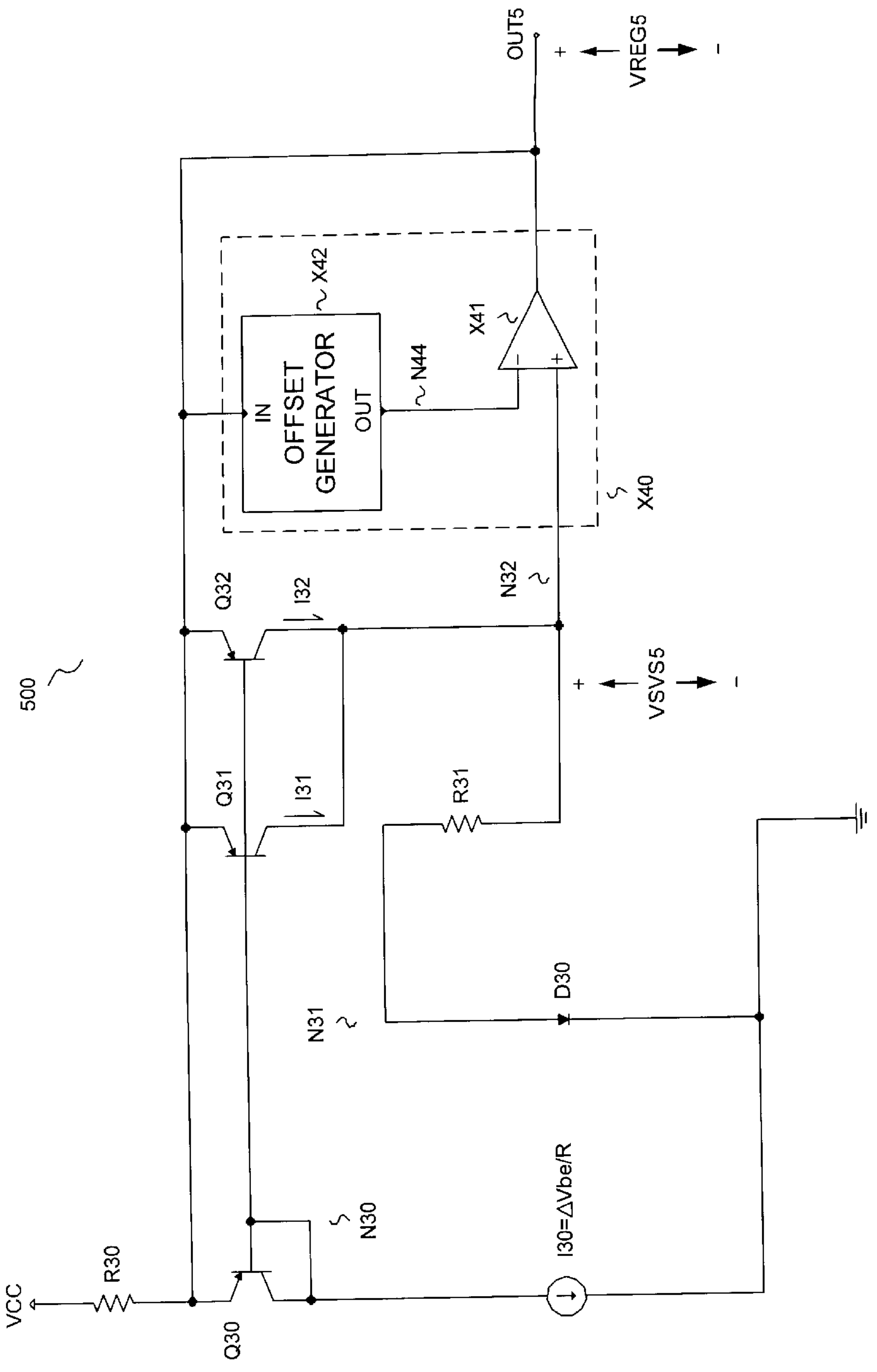
FIG. 5 is a schematic diagram of a reconfigured shunt regulator including a single cell voltage reference, in accordance with the present invention.

Another example of a shunt regulator that employs the teachings of the present invention is shown in FIG. 5. The schematic shown in FIG. 5 is identical to the schematic shown in FIG. 4, except that the resistor R32 has been eliminated, and the collector of transistor Q31 is connected to node N32 instead of node N31. Like components and connection nodes from FIG. 4 are labeled identically in FIG. 5. Node OUT5 replaces node OUT4. The output (VREG5) of the shunt regulator (500) shown in FIG. 5 now appears at node OUT5 instead of OUT4. The reference voltage (VSNS5) appears between node N42 and the circuit ground potential (GND).

As shown in FIG. 5, the collectors of transistors Q31 and Q32 are connected in common to node N42. Currents I31 and I32 sum together (2*ΔVbe/R) and flow through the series combination of resistor R31 and diode D30. The voltage drop (VSNS5) across the series combination will be higher than the diode voltage as given by: 2*R1*ΔVbe/R+Vdiode. When the offset generator (X42) generates an offset voltage that is 213 mV and the diode voltage (Vdiode) is 600 mV, the voltage reference (VSNS5) can provide a voltage of 987 mV at node N32. With a 987 mV reference the output voltage of the regulator (VREG5) is roughly 1.2V.

By the above-described arrangement, the same circuit components used for the other arrangements (e.g., as shown in FIGS. 3–5) may be reconfigured for use as other voltage references. Thus, the arrangement of components may be integrated into a single chip with a single metal mask change to provide variations in use. In the example where the reference is configured as a 1.2 V reference, resistor R32 is decoupled from the circuit by a metal mask change, and the collector of transistor Q31 is coupled to node N32 by the same metal mask change. By simplifying the overall design of the shunt regulator, the shunt regulator can be implemented as a standard cell component with minimal mask changes to provide other variations in regulation voltage.

In light of the above description, it is understood and appreciated that the circuit shown in FIGS. 3–5 may be arranged to operate with NPN transistors instead of PNP transistors. Additionally, it is understood and appreciated that the design may be further arranged to operate using one or more other transistor types including, but not limited to JFET transistors, MOSFET transistors, GaAsFET transistors as well as others.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus that provides a reference voltage that operates from a low-voltage power supply, comprising:

a current source circuit is arranged to provide a current that is proportional to a change in base-emitter voltage and inversely proportional to a reference resistance value;

a diode circuit that is coupled to the current source, wherein the diode circuit has an associated diode voltage;

a first resistive circuit that is series coupled to a second resistive circuit, the first resistive circuit and the second resistive circuit sharing a common node, the first and second resistive circuits are arranged in parallel with the diode device to provide a first voltage contribution at the common node that is associated with the current source that is lower than the associated diode voltage; and another current source circuit is arranged to provide another current to the common node, wherein the another current is proportional to the current such that a second voltage contribution is provided at the common node, wherein the reference voltage is given as the sum of the first voltage contribution and the second voltage contribution.

2. An apparatus as in claim 1, further comprising a buffer circuit having an input terminal that is coupled to the common node and an output terminal that is arranged to provide the reference voltage in response to the total voltage at the common node.

3. An apparatus as in claim 1, further comprising an amplifier circuit having an input terminal that is coupled to the common node and an output terminal that is arranged to provide the reference voltage, wherein the amplifier circuit is arranged to provide a scaling factor such that the reference voltage is associated with the total voltage at the common node scaled by the scaling factor.

4. An apparatus as in claim 1, wherein the other current is matched to the current.

5. An apparatus as in claim 1, wherein the reference voltage is given as the sum of a first constant times the associated diode voltage and a second constant times the change in the base-emitter voltage, wherein the first constant is determined by a ratio of a first resistance value corresponding to the first resistive circuit and a second resistance value corresponding to the second restive circuit, and the second constant is determined by the parallel combination of the first and second resistance values divided by the reference resistance value.

6. An apparatus as in claim 1, wherein the first resistive circuit and the second resistive circuit are arranged such that the reference voltage is a temperature compensated voltage.

7. An apparatus as in claim 1, further comprises a biasing circuit that includes a band-gap circuit that is arranged to bias the current source circuit and the other current source circuit.

8. An apparatus that provides a regulated voltage from an unregulated power supply that has a first and a second power supply terminal, where the first terminal is coupled to the regulated voltage through a resistor circuit, comprising:

a first current source circuit that provides a first current to a first node in response to a control signal;

a second current source circuit that provides a second current to a second node in response to the control signal;

a control signal generator that provides the control signal in response to a reference current that is proportional to a change in base-emitter voltage and inversely proportional to a resistance such that the first current and the second current are proportional to the reference current;

a diode circuit that is coupled between the first node and the second power supply terminal, the diode circuit having an associated diode voltage;

a resistance circuit is coupled between the first node and the second node;

another resistance circuit is coupled between the second node and the second power supply terminal; and a buffer circuit that has an input that is coupled to the second node and an output that provides the regulated voltage such that the regulated voltage is associated with a reference voltage at the second node.

9. An apparatus as in claim 8, wherein the control signal generator circuit includes a band-gap circuit that is arranged to provide the reference current.

10. An apparatus as in claim 8, wherein the buffer circuit includes an offset voltage generator circuit that provides an offset voltage between the regulated voltage and the reference voltage.

11. An apparatus as in claim 8, wherein the buffer circuit provides a scaling factor between the reference voltage and the regulated voltage such that the regulated voltage is associated with a scaled version of the reference voltage that is scaled by the scaling factor.

12. An apparatus as in claim 8 wherein the buffer is an operational amplifier circuit that includes an output that is arranged to provide the regulated voltage, a non-inverting input that is coupled to the second node, and an inverting input that is coupled to the output of the operational amplifier.

13. An apparatus as in claim 12, wherein the operational amplifier is arranged to provide an offset voltage between the inverting input and the non-inverting input such that the regulated voltage is higher than the reference voltage by the offset voltage.

14. An apparatus for providing a regulated voltage from an unregulated power supply that has a first and a second power supply terminal, where the first terminal is coupled to the regulated voltage through a resistor circuit, comprising:

a means for providing a first current is arranged to provide the first current in response to a control signal;

a means for providing a second current is arranged to provide the second current in response to the control signal;

a means for providing a control signal is arranged to provide the control signal in response to a reference current such that the first current and the second current are proportional to the reference current, wherein the reference current is proportional to a change in base-emitter voltage and inversely proportional to a resistance;

a diode means is arranged to provide a diode voltage that is responsive to the first current;

a first resistance means is coupled between the diode means and a reference node;

a second resistance means is coupled between the reference node and the second power supply terminal; and a means for buffering is arranged to produce the regulated voltage from a reference voltage that is associated with the reference node.

15. An apparatus as in claim 14, wherein the means for buffering includes a means for offsetting that is arranged to provide an offset voltage between the regulated voltage and the reference voltage such that the means for providing the first current and the means for providing the second current operate as current sources when the regulated voltage is near the unregulated power supply voltage.

16. An apparatus as in claim 14, wherein the second means for providing the second current is arranged to provide a current to the reference node such that the second current contributes a portion of the reference voltage at the reference node.

17. An apparatus as in claim 14, wherein the first resistance means and the second resistance means are arranged to provide a voltage scaling factor such that at least a portion of the reference voltage is scaled by a ratio of the first resistance means and the second resistance means.

18. An apparatus as in claim 14, further comprising means for decoupling the second resistance means from the reference node such that the first means for providing the first current and the second means for providing the second current are drive the first current and the second current through a series combination of the first resistance means and the diode means.

19. A method of providing a regulated voltage from an unregulated power supply that is coupled to the regulated voltage through a series circuit, the method comprising:

generating a first current that is proportional to a reference current, wherein the reference current is proportional to a change in a base-emitter voltage and inversely proportional to a resistance value;

generating a second current that is proportional to the reference current;

biasing a diode circuit with at least one of the first current and the second current to provide a diode voltage;

coupling a first resistance circuit between the diode and a reference node;

coupling a second resistance circuit to between the reference node and a circuit ground potential such that the first and second resistance circuits produce a portion of a reference voltage at the reference node by dividing the diode voltage;

coupling the second current to the reference node to produce a portion of a reference voltage at the reference node such that associated temperature coefficients of the first resistance circuit and the second resistance circuit are cancelled by another associated temperature coefficient of the resistance value wherein the reference voltage is given by the sum of a first constant times the diode voltage and a second constant times the change in the base-emitter voltage; and buffering the reference voltage to produce the regulated voltage from the reference voltage.

20. A method as in claim 19, further comprising providing an offset between the reference voltage and the regulated voltage to ensure proper generation of the first current and the second current.

* * * * *

UNITED STATES PATENT AND TRADEMARK OFFICE

CERTIFICATE OF CORRECTION

PATENT NO. : 6,380,723 B1
DATED : April 30, 2002
INVENTOR(S) : Don R. Sauer

It is certified that error appears in the above-identified patent and that said Letters Patent is hereby corrected as shown below:

Column 2,
Line 28, replace the word "another" which precedes the words "current is proportional" with the word -- other --

Column 5,
Line 49, remove duplicate word "that" before the words "that includes"

Column 7,
Line 9, remove the word "are" before the words "scaling factor"

Column 8,
Lines 17 and 18, replace the word "another" which precedes the words "current is proportional" with the word -- other --

Column 10,
Line 22, remove the word "are" before the words "drive the first current"

Signed and Sealed this

Fourth Day of February, 2003

JAMES E. ROGAN
*Director of the United States Patent and Trademark Office*